Figure 1:
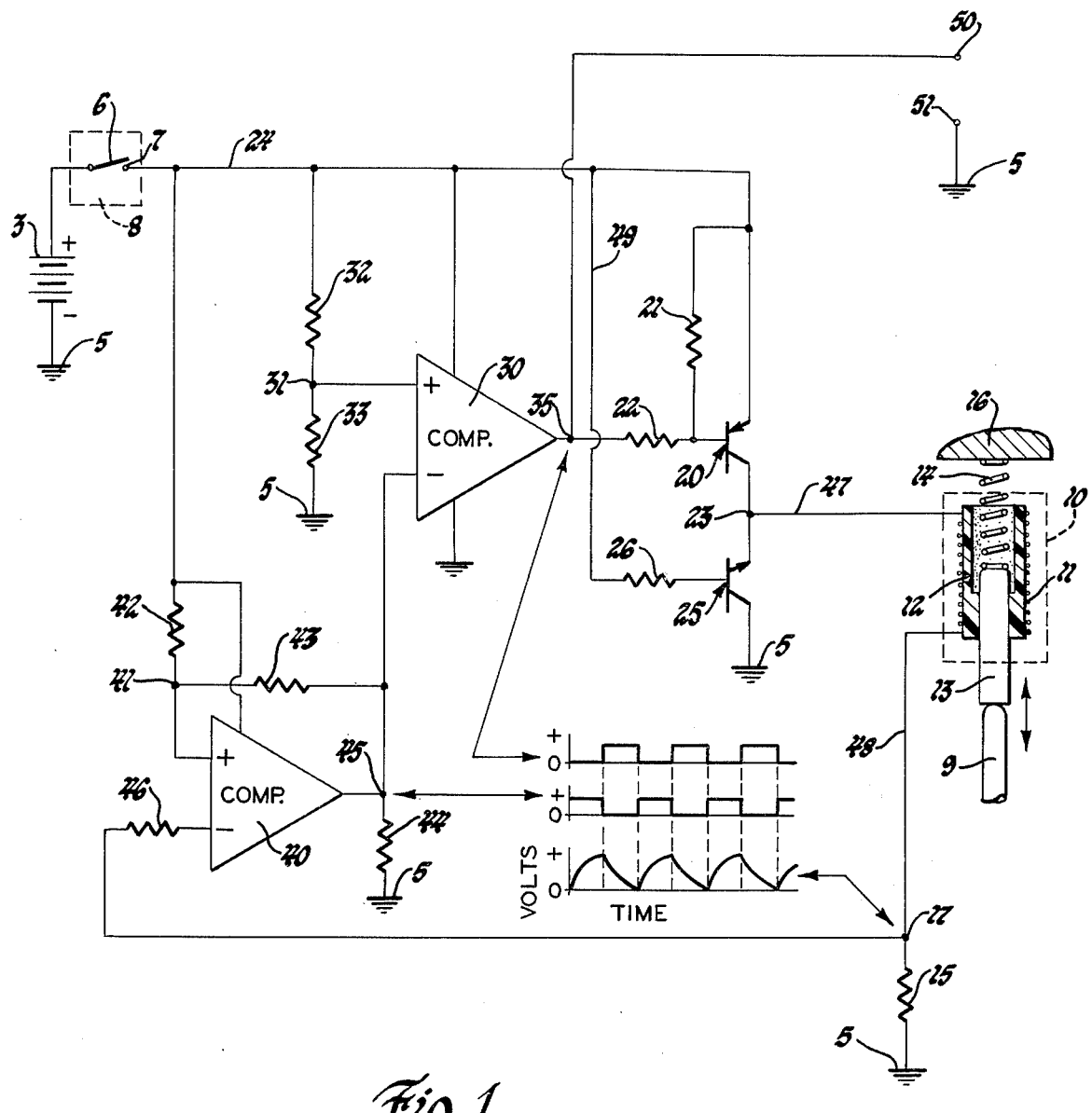

United States Patent [19]

Buetemeister

[11] 4,123,729

[45] Oct. 31, 1978

[54] DISPLACEMENT TRANSDUCER

[75] Inventor: Earl H. Buetemeister, Alexandria, Ind.

[73] Assignee: General Motors Corporation, Detroit, Mich.

[21] Appl. No.: 818,006

[22] Filed: Jul. 22, 1977

[51] Int. Cl.² ............................................. F02B 33/00
[52] U.S. Cl. ................................ 331/181; 123/119 A; 331/111
[58] Field of Search .................... 123/119 A; 331/111, 331/181, 151; 328/1

[56] References Cited

U.S. PATENT DOCUMENTS 3,883,826  5/1975  Kirby .................................. 331/181

Primary Examiner—John Kominski
Attorney, Agent, or Firm—Richard G. Stahr

[57] ABSTRACT

The movable core member magnetically coupled to the inductance coil of a variable inductor element is adapted for operation by a monitored displaceable member. Circuitry is provided for effecting a series of inductance coil charge and discharge cycles at a rate determined by the inductance value of the inductance coil as established by the position of the movable core member. Included in this circuitry is a circuit element of the type having two operating conditions which, in one operating condition, is effective to control switching circuitry to establish an inductance coil charge cycle; is switched, when the inductance coil charge current has reached a predetermined level, to the other operating condition in which it is effective to control the switching circuitry to establish an inductance coil discharge cycle and is switched, when the inductance coil discharge current has reduced to a predetermined level, to the original operating condition to initiate another inductance coil charge cycle. The system output signal is taken from the output circuit of this device while it is in a selected one of its conditions of operation.

6 Claims, 3 Drawing Figures

DISPLACEMENT TRANSDUCER

This invention is directed to an improved displacement transducer and, more specifically, to an improved displacement transducer which produces a series of digital output signals of a repetition rate determined by the displacement of a monitored displaceable member from a reference position.

Prior art displacement transducers are of either the differential transformer type or the variable frequency oscillator type in which the inductance value of the inductor member of a parallel inductor-capacitor tank circuit combination is varied in response to linear displacement.

The differential transformer type displacement transducers have certain characteristic disadvantages. It is extremely difficult, if not impossible, to construct such a transducer which does not have at least some slight asymmetry in the primary and secondary windings and stray capacitances may produce an undesirable phase shift. Either primary-secondary winding asymmetry or stray capacitances or both may introduce error.

The variable frequency oscillator type linear transducers also have characteristic disadvantages. The capacitor element of the tank circuit in particular is subject to changes in capacitance value with changes of temperature, humidity and age, a condition which may introduce considerable error in output signal frequency with changes of ambient conditions and length of service.

As the primary winding of the differential transformer type displacement transducers are excited by a high frequency alternating current signal and since the variable frequency oscillator displacement transducers of the tank circuit type produce sine wave output signals, with digital processing applications, it is necessary that the output signals of both these types be processed by additional wave shaping circuitry.

The provision, therefore, of a displacement transducer which obviates the disadvantages of displacement transducers of the prior art by eliminating the need for differential transformers and inductance-capacitance tank circuits and which produces digital output signals which eliminates the necessity of additional wave squaring circuitry is desirable.

It is, therefore, an object of this invention, to provide an improved displacement transducer.

It is another object of this invention to provide an improved displacement transducer which produces digital output signals of a repetition rate determined by the displacement of a monitored displaceable member from a reference position.

It is another object of this invention to provide an improved displacement transducer employing only resistance and inductance frequency determining elements.

It is another object of this invention to provide an improved displacement transducer which is sensitive to inductance coil charge and discharge current levels to produce a series of output signals of a repetition rate determined by the inductance value of an inductance coil.

In accordance with this invention, a displacement transducer for producing a series of digital output signals of a repetition rate determined by the displacement of a monitored displaceable member from a reference position is provided wherein the movable core of a magnetically coupled inductance coil is operated by a monitored displaceable member and includes circuitry responsive to inductance coil charge and discharge current levels for producing a series of digital output signals of a repetition rate determined by the inductance value of the inductance coil.

Figure 2:
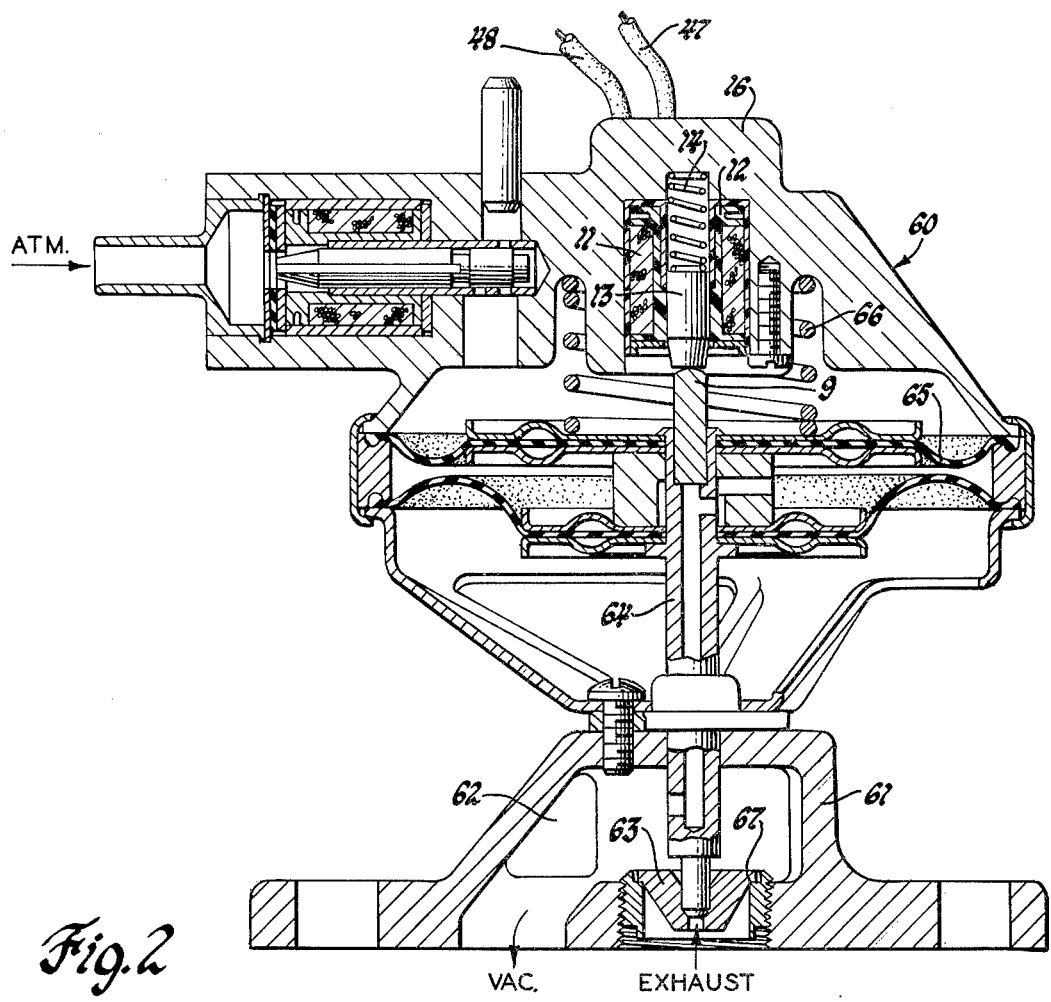
Figure 3:
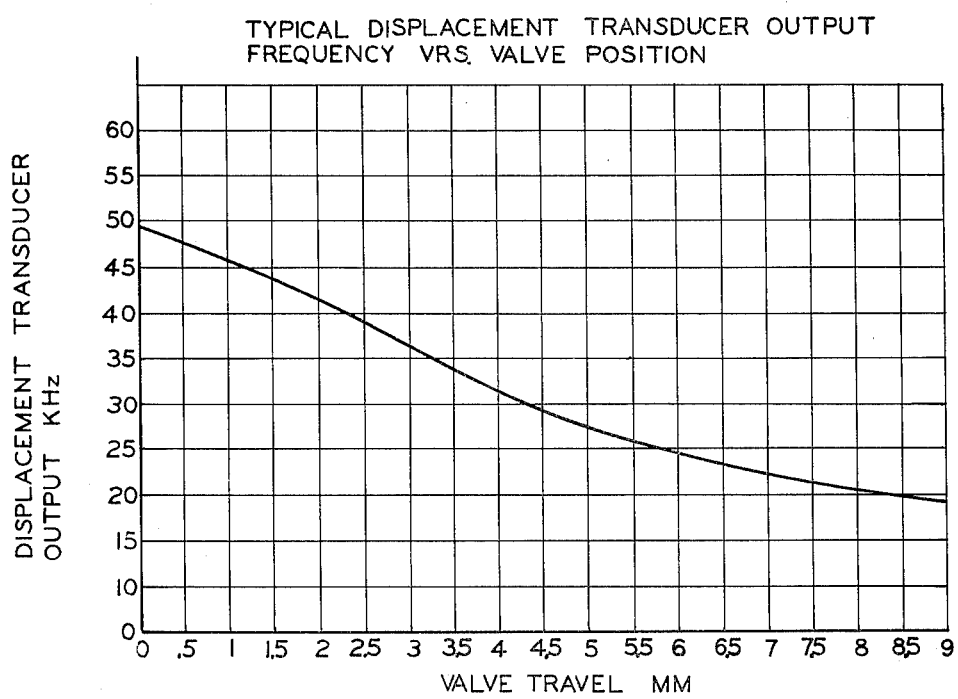

For a better understanding of the present invention, together with additional objects, advantages and features thereof, reference is made to the following description and accompanying drawing in which:

FIG. 1 sets forth the transducer of this invention partially in schematic and partially in block form;

FIG. 2 illustrates an embodiment of the circuit of FIG. 1 to indicate the position of an automotive type exhaust gas recirculating valve; and FIG. 3 illustrates the output frequency versus valve position curve for the displacement transducer of this invention when employed in the embodiment of FIG. 2.

As point of reference or ground potential is the same point electrically throughout the system, it is illustrated in FIG. 1 of the drawing by the accepted schematic symbol and is referenced by the numeral 5.

Conventional voltage comparator circuits having two operating conditions may be employed to practice this invention. As these circuit elements are commercially available items well known in the art and, per se, form no part of this invention each has been illustrated in block form in the drawing. In an actual embodiment, the voltage comparator circuits employed are commercially available devices marketed by the National Semiconductor Corporation under the designation LM339. Furthermore, these devices are only examples of circuit elements suitable for use with the displacement transducer of this invention, consequently, there is no intention or inference of a limitation thereto as other circuitry and elements having similar electrical characteristics may be substituted therefor without departing from the spirit of the invention.

Referring to FIG. 1 of the drawing, system operating potential may be supplied by a conventional automotive type storage battery 3 having the negative polarity output terminal connected to point of reference or ground potential 5 and the positive polarity output terminal connected to the movable contact 6 of a single pole-single throw electrical switch 8 also having a stationary contact 7. Electrical switch 8 may be any of the many single pole-single throw commercially available electric switches well known in the art or, when the displacement transducer of this invention is employed without automotive applications, it may be the movable and one of the stationary contacts of a conventional automotive type ignition switch with which the movable contact thereof is in the electrical circuit closed condition while the switch is in the "Run" position.

The element of the displacement transducer of this invention which senses the displacement of a monitored displaceable member 9 from a reference position is a variable inductor element 10 including an inductance coil 11 which may be wound upon a spool 12 of insulating material and a magnetically coupled movable core member 13 of a magnetic material which may be any of the many commercially available ferrite materials. Movable core member 13 is located within spool 12 and may be spring biased in a downward direction as looking at FIG. 1 by a conventional helical compression spring 14 arranged to engage the top end, as viewing FIG. 1, of movable core member 13 and any convenient stationary object or element 16. Alternatively, movable core member 13 may be mechanically interconnected with the monitored displaceable member 9 in such a manner that it is operated by movement of monitored displaceable member 9.

Circuitry is provided for effecting a series of inductance coil 11 charge and discharge cycles at a rate determined by the inductance value of inductance coil 11 as established by the relative position of movable core member 13 and for producing a series of digital output signals. This circuitry includes an electrical switching arrangement consisting of PNP transistor 20 and NPN transistor 25, conventional voltage comparator circuits 30 and 40 and the associated biasing circuitry and current sensing resistor 15. The output terminal of each of voltage comparator circuits 30 and 40 is the uncommitted collector electrode of a grounded emitter NPN output transistor.

Junction 31 of the voltage divider circuit including series resistors 32 and 33 connected across positive polarity potential lead 24 and point of reference or ground potential 5 is connected to the non-inverting input terminal of voltage comparator circuit 30, the inverting input terminal thereof being connected to the output terminal 45 of voltage comparator circuit 40. Junction 41 of the voltage divider circuit including series connected resistors 42, 43 and 44 connected across positive polarity potential lead 24 and point of reference or ground potential 5 is connected to the non-inverting input terminal of voltage comparator circuit 40, the inverting input terminal thereof being connected through input resistor 46 to junction 17 between inductance coil 11 and current sensing resistor 15. In addition to being connected to the inverting input terminal of voltage comparator circuit 30, the output terminal 45 of voltage comparator circuit 40 is also connected to the junction between series resistors 43 and 44 of the voltage divider circuit previously described. Resistor 21 connected across the emitter-base electrodes of PNP switching transistor 20 provides the proper emitter-base bias on this device.

Upon the initial operation of movable contact 6 of switch 8 into electrical circuit closing relationship with stationary contact 7, substantially battery 3 potential appears across positive polarity potential lead 24 and point of reference or ground potential 5; a potential of a positive polarity with respect to point of reference or ground potential 5 and of a level equal to the drop across resistor 33 appears upon junction 31; an electrical reference of a selected first potential level equal to the drop across series resistors 43 and 44 and of a positive polarity with respect to point of reference or ground potential 5 appears upon junction 41 and junction 17 is at substantially ground potential. In response to the substantially ground signal and the electrical reference signal of the selected first level applied respectively to the inverting and non-inverting input terminals thereof, voltage comparator circuit 40 produces a positive polarity potential output signal upon output terminal 45, the middle curve of FIG. 1, of a level substantially equal to the drop across resistor 44 as the NPN output transistor is rendered non-conductive in response to this input signal combination. This positive polarity potential signal is applied to the inverting input terminal of voltage comparator circuit 30. Resistors 42, 43 and 44 are so proportioned that the potential drop across resistor 44 and present upon output terminal 45 of comparator circuit 40 is of a higher level than is the potential drop across resistor 33 which is present upon junction 31. In response to the positive polarity potential signal applied to the inverting input terminal thereof of a level higher than that of the signal applied to the non-inverting input terminal, voltage comparator circuit 30 produces a substantially ground output signal upon output terminal 35, the top curve of FIG. 1, as the NPN output transistor is rendered conductive in response to this signal combination. Voltage comparator circuit 30, therefore, is in the first of its two operating conditions. With a substantially ground signal present upon the output terminal 35 of voltage comparator circuit 30 because of the conducting NPN output transistor, emitter-base drive current is supplied to PNP switching transistor 20 through a circuit which may be traced from the positive polarity terminal of battery 3, through closed contacts 6 and 7 of switch 8, positive polarity potential lead 24, the emitter-base electrodes of PNP switching transistor 20, resistor 22, the collector-emitter electrodes of the conducting NPN output transistor of voltage comparator circuit 30 and point of reference or ground potential 5 to the negative polarity terminal of battery 3. This emitter-base drive current triggers PNP switching transistor 20 conductive through the emitter-collector electrodes thereof. Upon the conduction of PNP switching transistor 20, the potential upon junction 23 is of a positive polarity and of a level substantially equal to the potential of battery 3 which reverse emitter biases NPN switching transistor 25 and an inductance coil 11 charge cycle is initiated through a charge circuit completed thereby which may be traced from the positive polarity terminal of battery 3, through closed contacts 6 and 7 of switch 8, positive polarity potential lead 24, the emitter-collector electrodes of PNP switching transistor 20, lead 47, inductance coil 11, lead 48, current sensing resistor 15, and point of reference or ground potential 5 to the negative polarity terminal of battery 3. Although battery 3 potential is applied to the base electrode of NPN switching transistor 25, the reverse emitter bias potential upon junction 23 maintains this device non-conductive.

Upon the completion of the inductance coil 11 charge circuit just described, charge current flows therethrough and through current sensing resistor 15 during the charge cycle. As this charge current builds up exponentially from zero at a rate determined by the inductance value of inductance coil 11, a potential is generated across current sensing resistor 15 which is proportional to this inductance coil 11 charge current as indicated by the lowest curve of FIG. 1. When the voltage generated across current sensing resistor 15 increases to a level substantially equal to that applied to the non-inverting input terminal of voltage comparator circuit 40 from junction 41, voltage comparator circuit 40 switches to the other operating condition in which the NPN output transistor thereof is conductive. With the NPN output transistor of voltage comparator circuit 40 conducting, resistor 44 is short-circuited thereby, consequently, the signal upon output terminal 45 goes to substantially ground potential, as indicated by the middle curve of FIG. 1. Upon the short-circuiting of resistor 44, the electrical reference upon junction 41 is reduced to a second lower level equal to the potential drop across resistor 43 and the small potential drop across the collector-emitter electrodes of the comparator circuit 40 output NPN transistor and is of a positive polarity with respect to point of reference or ground potential 5. The substantially ground signal upon output terminal 45 is applied to the inverting input terminal of voltage comparator circuit 30 which, with a positive polarity potential signal present upon the non-inverting terminal thereof from junction 31, switches to the second condition of operation in which the NPN output transistor thereof is not conductive. With the NPN output transistor of voltage comparator circuit 30 not conducting, a positive polarity output potential signal of a level substantially equal to that of the potential of battery 3 appears upon output terminal 35, as indicated by the top curve of FIG. 1, and the circuit previously described, through which emitter-base drive current is supplied to PNP transistor is interrupted. Upon the interruption of the circuit through which emitter-base drive current is supplied to PNP transistor 20, this device goes not conductive to interrupt the previously described inductance coil 11 charge circuit and to remove the reverse emitter bias from NPN switching transistor 25. With the reverse emitter bias removed from NPN switching transistor 25, emitter-base drive current is supplied thereto through a circuit which may be traced from a positive polarity terminal of battery 3 through closed contacts 6 and 7 of switch 8, positive polarity potential lead 24, lead 49, input resistor 26, the base-emitter electrodes of NPN switching transistor 25, lead 47, inductance coil 11, lead 48, current sensing resistor 15 and point of reference or ground potential 5 to the negative polarity terminal of battery 3. This base-emitter drive current conditions NPN switching transistor 25 for forward collector-emitter conduction. Upon the interruption of the inductance coil 11 charge circuit, the resulting collapsing magnetic field induces a potential in inductance coil 11 of a positive polarity upon the terminal end thereof connected to lead 48 with respect to the terminal end connected to lead 47. This induced potential is applied through lead 48, current sensing resistor 15 and point of reference or ground potential 5 and through lead 47 across the collector-emitter electrodes, respectively, of NPN switching transistor 25 in the proper polarity relationship for forward collector-emitter conduction through an NPN transistor. Transistor 25, therefore, conducts through the collector-emitter electrodes. Upon the conduction of NPN switching transistor 25, an inductance coil 11 discharge cycle is initiated through a discharge circuit completed thereby which may be traced from the terminal end of inductance coil 11 connected to lead 48, through lead 48, current sensing resistor 15, point of reference or ground potential 5, the collector-emitter electrodes of NPN switching transistor 25 and lead 47 to the opposite terminal end of inductance coil 11.

The inductance coil 11 discharge current decreases exponentially at a rate determined by the inductance value of inductance coil 11, as indicated by the lowest curve of FIG. 1. Consequently, the potential drop across current sensing resistor 15 decreases proportionally and is applied from junction 17 through input resistor 46 to the inverting input terminal of voltage comparator circuit 40. When the level of this potential signal has decreased to a value substantially equal to that of the electrical reference of the selected second lower level present upon junction 41, voltage comparator circuit 40 switches to the second operating condition in which the NPN output transistor thereof is not conductive. With the NPN output transistor of voltage comparator circuit 40 not conductive, a positive polarity potential signal is present upon output terminal 45 of a level equal to the potential drop across resistor 44, as indicated by the middle curve of FIG. 1, and the electrical reference upon junction 41 increases to the selected first level equal to the potential drop across resistors 43 and 44.

From this description, it is apparent that comparator circuits 30 and 40 are responsive to the increase of inductance coil 11 charge current to a selected first level as determined by an electrical reference upon junction 41 of a selected first level for initiating an inductance coil 11 discharge cycle and for reducing the electrical reference upon junction 41 to a selected second lower level and responsive to the decrease of inductance coil 11 discharge current to a selected second level as determined by the selected second lower level of the electrical reference upon junction 41 for initiating an inductance coil 11 charge cycle and for increasing the electrical reference upon junction 41 to the selected first level.

The positive polarity potential signal upon output terminal 45 of comparator circuit 40 of a level greater than that upon junction 31, as previously described, is applied to the inverting input terminal of voltage comparator circuit 30. In response to this input signal combination, voltage comparator circuit 30 switches to the first condition of operation in which the NPN output transistor thereof is conductive. With the NPN output transistor of voltage comparator circuit 30 conducting, substantially ground potential is present upon output terminal 35, as indicated by the top curve of FIG. 1. Upon this transition of operating states of comparator circuit 30 the circuit previously described through which emitter-base drive current is supplied to PNP switching transistor 20 is completed to trigger this device conductive through the collector-emitter electrodes. Upon the conduction of PNP switching transistor 20, NPN switching transistor 25 is reverse emitter biased and, as a consequence, rendered not conductive to interrupt the inductance coil 11 discharge circuit and the inductance coil 11 charge circuit previously described is completed to initiate another inductance coil 11 charge cycle.

So long as movable contact 6 of switch 8 is maintained in electrical circuit closed condition with stationary contact 7, the displacement transducer continues to function in a manner just described to produce a series of digital output signals upon output terminal 35 of comparator circuit 30, the top curve of FIG. 1, which may be applied to external utilization circuitry through output terminals 50 and 51. The nature of the external utilization circuitry is determinative as to whether the output signals utilized are of the ground or positive polarity or whether the transition of either to the other is utilized.

As the rate at which the inductance coil 11 charge current increases during a charge cycle upon the completion of the charge circuit and the rate at which the inductance coil 11 discharge current decreases during a discharge cycle upon the completion of the discharge circuit is determined by the inductance value of inductance coil 11, the repetition rate of the series of output signals produced upon output terminal 35 of comparator circuit 30 is determined by the position of movable core member 13 relative to inductance coil 11 which is, of course, established by the displacement of displaceable member 9 from a reference position, the repetition rate of the digital output signals being inversely proportional to the inductance value of inductance coil 11.

In an actual application, the displacement transducer of this invention was employed to sense the position of an automotive type exhaust gas recirculation valve. Referring to FIG. 2 wherein elements corresponding to like elements in FIG. 1 are assigned like characters of reference, an exhaust gas recirculation (EGR) valve assembly 60 having a valve body 61 forming an EGR passage 62 to interconnect the engine exhaust passage with the engine air induction passage is illustrated. An EGR valve 63 controls the flow of exhaust gases through EGR passage 62 and is positioned by a valve stem 64 secured to a diaphragm 65. Diaphragm 65 is biased by a spring 66 to engage EGR valve 63 with a seat 67 and inhibit recirculation of exhaust gases through passage 62. Inductance coil 11 and movable core member 13 are mounted in the cover 16 for EGR valve assembly 60. Movable core member 13 is biased by helical compression spring 14 in a direction to engage a pin 9 carried by valve stem 64. Movable core member 13, therefore, is arranged to be operated by pin 9 which is, in turn, operated by stem 64. The amount of exhaust gas recirculation supplied to the associated engine is determined by the displacement of EGR valve 63 from seat 67 wherein the reference position is the position in which EGR valve 63 is tightly closed to seat 67. As more or less exhaust gas recirculation is required, valve stem 64 and, as a consequence, pin 9 is operated by diaphragm 65 in respective up and down directions, as viewing FIG. 2, to operate movable core member 13 up and down within the bore of inductance coil 11. The displacement transducer of this invention, therefore, produces a series of digital output signals of a repetition rate determined by the position of stem 64 and EGR valve 63. These digital output signals are supplied to external digital utilization circuitry.

In the actual embodiment, movable core 13 is a rod of a ferrite magnetic material of circular cross-section 0.124 inch in diameter and 0.51 inch in length. Inductance coil 11 is 1200 turns of 0.005 inch diameter enamel coated copper wire wound into a coil having an outside diameter of 0.455 inch, an inside diameter of 0.185 inch, a length of 0.4 inch, an inductance value of 4.9 millihenries at one kilohertz and a direct current resistance of 29.4 ohms.

The construction and operation of exhaust gas recirculation valve assembly 60 is similar to that shown and described in U.S. Pat. Nos. 3,762,384, Day et al, dated Oct. 3, 1973 and 3,800,765, Thompson, dated Apr. 2, 1974, and United States patent application Ser. No. 717,283, Sheffer et al, filed Aug. 24, 1976, all of which are assigned to the same assignee as is this application.

FIG. 3 illustrates the displacement transducer output signal repetition rate in kilohertz plotted against EGR valve 63 travel in millimeters as employed in the actual embodiment.

While a preferred embodiment of the present invention has been shown and described, it will be obvious to those skilled in the art that various modifications and substitutions may be made without departing from the spirit of the invention which is to be limited only within the scope of the appended claims.

What is claimed is:

1. A circuit for producing a series of substantially square wave output signals of a repetition rate determined by the inductance value of the inductance coil of a variable inductor device comprising in combination with a unidirectional supply potential source: switching means electrically operable in a manner to alternately connect said inductance coil to a charge circuit including said supply potential source and to a discharge circuit; and means for effecting a series of inductance coil charge and discharge cycles at a switching frequency determined by the inductance value of said inductance coil, said last named means including first circuit means responsive to the rise of inductance coil charge current to a selected first level as determined by a reference voltage of a selected first level for producing a first electrical signal and for reducing said reference voltage to a selected second level and responsive to the fall of inductance coil discharge current to a selected second level as determined by said selected second level of said reference voltage for producing a second electrical signal and for increasing said reference voltage to said selected first level and second circuit means responsive to said first and second electrical signals for operating said switching means in a manner to connect said inductance coil to said charge circuit and to said discharge circuit alternatively at a switching frequency determined by the inductance value of said inductance coil and for producing a series of substantially square wave output signals.

2. A circuit for producing a series of substantially square wave output signals of a repetition rate determined by the inductance value of the inductance coil of a variable inductor device comprising in combination with a unidirectional supply potential source: switching means electrically operable in a manner to connect said inductance coil to a charge circuit including said supply potential source upon the application of supply potential and, thereafter, to connect said inductance coil to a discharge circuit and to said charge circuit alternately at a switching frequency determined by the inductance value of said inductance coil; first circuit means coupled to said inductance coil and responsive to the rise of inductance coil charge current to a selected first level as determined by a reference voltage of a selected first level for producing a first electrical signal and for reducing said reference voltage to a selected second level and responsive to the fall of inductance coil discharge current to a selected second level as determined by said selected second level of said reference voltage for producing a second electrical signal and for increasing said reference voltage to said selected first level; means connected across said supply potential source for developing said reference voltage in such a manner that said selected first and second levels both vary in the same direction as the voltage level of said supply potential source varies whereby the ratio between said first and second reference voltage levels remains substantially constant with changes in supply potential source voltage level; and second circuit means responsive to said first and second electrical signals for operating said switching means in a manner to connect said inductance coil to said charge circuit and to said discharge circuit alternately and for producing a series of substantially square output signals.

3. A displacement transducer for producing a series of substantially square wave output signals of a repetition rate determined by the displacement of a monitored displaceable member from a reference position comprising in combination with a unidirectional supply potential source: a variable inductor element including an inductance coil and a magnetically coupled movable core member adapted for operation by a said monitored displaceable member for establishing the inductance of said inductance coil at a value corresponding to the displacement of said monitored displaceable member from said reference position; switching means electrically operable in a manner to alternately connect said inductance coil to a charge circuit including said supply potential source and to a discharge circuit; first pulse producing means coupled to said inductance coil for producing a series of first and second electrical signals of a frequency that is a function of the inductance value of said inductance coil as established by said movable core member in response to said inductance coil charge current increasing to a predetermined magnitude and discharge current decreasing to a lower predetermined magnitude, respectively; and second pulse producing means responsive to said series of first and second electrical signals and effective to operate said switching means in a manner to alternately connect said inductance coil to said charge circuit and to said discharge circuit and to produce a series of substantially square wave output signals.

4. A displacement transducer for producing a series of substantially square wave output signals of a repetition rate determined by the displacement of a monitored displaceable member from a reference position comprising in combination with a unidirectional supply potential source: a variable inductor element including an inductance coil and a magnetically coupled movable core member adapted for operation by a said monitored displaceable member for establishing the inductance of said inductance coil at a value corresponding to the displacement of said monitored displaceable member from said reference position; switching means electrically operable in a manner to alternately connect said inductance coil to a charge circuit including said supply potential source and to a discharge circuit; circuit means responsive to the increase of inductance coil charge current to a selected first level as determined by a reference voltage of a selected first level for producing a first electrical signal of a selected polarity and for reducing said reference voltage to a selected second level and responsive to the decrease of inductance coil discharge current to a selected second level as determined by said selected second level of said reference voltage for producing a second electrical signal of another polarity and for increasing said reference voltage to said selected first level; and means responsive to said first and second electrical signals and effective to operate said switching means in a manner to alternately connect said inductance coil to said charge circuit and to said discharge circuit and to produce a series of substantially square wave output signals.

5. A displacement transducer for producing a series of substantially square wave output signals of a repetition rate determined by the displacement of a monitored displaceable member from a reference position comprising in combination with a unidirectional supply potential source; a variable inductor element including an inductance coil and a magnetically coupled movable core member adapted for operation by a said monitored displaceable member for establishing the inductance of said inductance coil at a value corresponding to the displacement of said monitored displaceable member from said reference position; first circuit means electrically operable to first and second operating conditions in response to applied electrical signals for producing an output signal of a selected polarity while in a selected one of said operating conditions; first and second switching devices each of the type electrically operable to electrical circuit open and closed conditions arranged to be controlled by said first circuit means, a selected one of said switching devices being effective to connect said inductance coil in a charge circuit including said supply potential source while said first circuit means is in a selected one of said first and second operating conditions and the other said switching device being effective to connect said inductance coil in a discharge circuit while said first circuit means is in the other one of said operating conditions; and second circuit means responsive to the increase of inductance coil charge current to a selected first level for producing a first electrical signal effective to operate said first circuit means to the said other one of said operating conditions in which said second switching device is effective to connect said inductance coil in a discharge circuit and responsive to the decrease of inductance coil discharge current to a selected second lower level for producing a second electrical signal effective to operate said first circuit means to the said selected one of said first and second operating conditions in which said first switching device is effective to connect said inductance coil in a charge circuit whereby said first circuit means is operated between said first and second conditions of operation to produce a series of substantially square wave output signals.

6. A displacement transducer for producing a series of substantially square wave output signals of a repetition rate determined by the displacement of a monitored displaceable member from a reference position comprising in combination with a unidirectional supply potential source: a variable inductor element including an inductance coil and a magnetically coupled movable core member adapted for operation by a said monitored displaceable member for establishing the inductance of said inductance coil at a value corresponding to the displacement of said monitored displaceable member from said reference position; first circuit means electrically operable to first and second operating conditions in response to applied electrical signals for producing an output signal of a selected polarity while in a selected one of said operating conditions; a first switching device electrically operable to electrical circuit open and closed switch conditions arranged to be operated by said first circuit means and effective to connect said inductance coil in a charge circuit including said supply potential source while said first circuit means is in a selected one of said first and second operating conditions; a second switching device electrically operable to electrical circuit open and closed switch conditions arranged to be controlled by said first switching device in such a manner as to be operated to the said switch position opposite that to which said first switching device is operated and effective to connect said inductance coil in a discharge circuit while said first circuit means is in the other one of said operating conditions; and second circuit means responsive to the increase of inductance coil charge current to a selected first level as determined by a reference voltage of a selected first level for reducing said reference voltage to a second level and for producing a first electrical signal effective to operate said first circuit means to the said other one of said operating conditions in which said second switching device is effective to connect said inductance coil in a discharge circuit and responsive to the decrease of inductance coil discharge current to a selected second level as determined by said second level of said reference voltage for increasing said reference voltage to said selected first level and for producing a second electrical signal effective to operate said first circuit means to the said selected one of said first and second operating conditions in which said first switching device is effective to connect said inductance coil in a charge circuit whereby said first circuit means is operated between said first and second condition of operation to produce a series of substantially square wave output signals.

* * * * *